(12) United States Patent
Yoshida et al.

(10) Patent No.: US 9,815,644 B2
(45) Date of Patent: Nov. 14, 2017

(54) PAPER FEED ROLLER

(71) Applicant: SUMITOMO RIKO COMPANY LIMITED, Komaki-shi, Aichi (JP)

(72) Inventors: Yuma Yoshida, Kasugai (JP); Atsuhiro Kawano, Susono (JP); Kuniaki Doi, Susono (JP); Satoshi Suzuki, Inuyama (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 134 days.

(21) Appl. No.: 14/996,591

(22) Filed: Jan. 15, 2016

(65) Prior Publication Data

US 2016/0130098 A1    May 12, 2016

Related U.S. Application Data

(63) Continuation of application No. PCT/JP2014/065300, filed on Jun. 10, 2014.

(30) Foreign Application Priority Data

Jul. 30, 2013    (JP) .................. 2013-157766

(51) Int. Cl.
  *B65H 3/06*    (2006.01)
  *B65H 3/52*    (2006.01)
  *G01R 29/24*   (2006.01)

(52) U.S. Cl.
  CPC ............ *B65H 3/0638* (2013.01); *B65H 3/52* (2013.01); *G01R 29/24* (2013.01); *B65H 2404/186* (2013.01)

(58) Field of Classification Search
  CPC ...... B65H 3/0638; B65H 3/52; B65H 3/5207; B65H 3/5215; B65H 3/5223;
  (Continued)

(56) References Cited

U.S. PATENT DOCUMENTS 5,723,214 A * 3/1998 Yamazaki ............ A43B 1/0036
                                                      428/364
5,744,238 A * 4/1998 Limperis ............. B29C 37/0085
                                                      428/35.8
(Continued)

FOREIGN PATENT DOCUMENTS

JP   3-177414 A    8/1991
JP   2844998 B2    1/1999
(Continued)

OTHER PUBLICATIONS

Notification of Transmittal of Translation of the International Preliminary Report on Patentability (Form PCT/IB/338) issued in counterpart International Application No. PCT/JP2014/065300 dated Feb. 4, 2016, with English Translation of the International Report on Patentability (Form PCT/IPEA/409). (6 pages).

(Continued)

*Primary Examiner* — Jason L Vaughan
(74) *Attorney, Agent, or Firm* — Westerman, Hattori, Daniels & Adrian, LLP

(57) ABSTRACT

A paper feed roller including an elastic layer composed of thermosetting polyurethane containing a plasticizer, wherein an amount of the plasticizer is within a range of 10 to 50 pts. mass based on 100 pts. mass of the thermosetting polyurethane, and a surface residual charge on the elastic layer is within a range of 90 to 170 V. The surface residual charge is a value determined by single-point measurement of a surface potential of the elastic layer. The measurement includes rotating the paper feed roller in a circumferential direction, electrifying the surface of the elastic layer with a corotron while rotating the paper feed roller, and measuring the surface potential at a center point on the paper feed roller in a roller axis direction in a position where the paper feed (Continued)

roller is rotated by 90 degrees from a position where the surface of the elastic layer is electrified.

20 Claims, 2 Drawing Sheets

(58) Field of Classification Search
CPC .. B65H 3/5246; B65H 3/5253; B65H 3/5261; B65H 2404/186
USPC ........ 492/30, 31, 33, 34, 35, 36, 37, 38, 40, 492/48, 49, 53, 59
See application file for complete search history.

(56) References Cited

U.S. PATENT DOCUMENTS

| | | | | |
|---|---|---|---|---|
| 6,077,207 A * | 6/2000 | Yokoyama | ............. | B65H 27/00 492/18 |
| 6,319,181 B1 * | 11/2001 | Naoi | ................... | B29C 59/165 492/53 |
| 7,144,525 B2 * | 12/2006 | Yoshikawa | ............ | B65H 27/00 252/500 |
| 7,284,649 B2 * | 10/2007 | Shiraki | ................. | B65H 27/00 193/35 R |
| 7,641,188 B2 * | 1/2010 | Hiura | ...................... | B65H 3/06 271/122 |
| 7,703,761 B2 * | 4/2010 | Shiraki | .................... | B65H 5/06 271/109 |
| 8,515,318 B2 * | 8/2013 | Chiang | .............. | C08G 18/4238 252/519.33 |
| 8,579,775 B2 * | 11/2013 | Eun | .................... | G03G 15/0808 492/53 |
| 8,986,182 B2 * | 3/2015 | Tamura | ................... | F16C 13/00 492/48 |
| 9,586,774 B2 * | 3/2017 | Mine | ....................... | B65H 3/52 |
| 2006/0152166 A1 | 7/2006 | Iwamatsu et al. | | |

FOREIGN PATENT DOCUMENTS

| | | |
|---|---|---|
| JP | 2004-265603 A | 9/2004 |
| JP | 2005-200185 A | 7/2005 |
| JP | 2012-66896 A | 4/2012 |

OTHER PUBLICATIONS

Notification of Reasons for Refusal dated Nov. 15, 2016, issued in counterpart Japanese Patent Application No. 2013-157766, with English translation. (20 pages).

International Search Report dated Sep. 16, 2014, issued in counterpart Application No. PCT/JP2014/065300 (2 pages).

* cited by examiner

PAPER FEED ROLLER

TECHNICAL FIELD

The present invention relates to a paper feed roller.

BACKGROUND ART

Conventionally, in an image forming device, a paper feeding unit is generally provided to separate and send out paper sheets one by one from a paper sheet cassette containing the paper sheets to an image forming unit. While a paper feeding unit of a pad retarding type (FR type), or of a friction retarding type (FRR type) or the like is conventionally put into practical use, one in the FRR type is often employed because of high reliability in preventing duplicate feed of the paper sheets.

The paper feeding unit in the FRR type has: a picking-up roller which comes into contact with the uppermost part of paper sheets contained in a paper sheet cassette and draws the paper sheet out of the paper sheet cassette with friction force; a feeding roller which sends out the paper sheet drawn out to a paper sheet conveying path; and a retard roller which is brought into press contact with the feeding roller and is stopped or given rotational driving force in the reverse direction to the paper sheet conveying direction via a torque limiter.

In the paper feeding unit, when only one paper sheet passes through the press contact part of the feeding roller and the retard roller, slippage of the torque limiter allows the retard roller to be driven with the feeding roller and to rotate in the paper sheet conveying direction, and the feeding roller sends out the paper sheet in the conveying direction. On the other hand, when two or more paper sheets are to pass through the press contact part, the retard roller stops or rotates in the reverse direction to the paper sheet conveying direction and returns the paper sheet in contact with the retard roller in the direction to the paper sheet cassette, and the paper sheet in contact with the feeding roller is sent out in the conveying direction. Thus, duplicate feed of paper sheets is prevented.

These paper feed rollers generally have a shaft body and an elastic layer formed on the outer circumference of the shaft body. As a material composing the elastic layer, there is conventionally used EPDM, thermosetting polyurethane or the like. Thermosetting polyurethane is often employed since it has lower electric resistance and sticking of paper powder due to static electricity can be easily suppressed in comparison with EPDM. It should be noted that since thermosetting polyurethane itself has high hardness and a low coefficient of friction, a plasticizer is generally blended to secure a predetermined coefficient of friction (for example, refer to Patent Document 1).

PRIOR ART DOCUMENT

Patent Document

Patent Document 1: JP-B-2844998

SUMMARY OF THE INVENTION

Problem to be Solved by the Invention

However, the conventional art is problematic as follows. Blending a plasticizer in thermosetting polyurethane lowers the electric resistance, which fact is effective for preventing sticking of paper powder due to static electricity. Oversea or other paper sheets which contain much paper powder are being often used in recent years, and they largely cause request for resistance to sticking of paper powder. Nevertheless, it has been newly found that, in some cases, blending the plasticizer in thermosetting polyurethane results in a phenomenon that image concentration deteriorates in a portion, of a paper sheet, that is in contact with the paper feed roller (phenomenon of defects in toner transfer). In particular, the aforementioned phenomenon of defects in toner transfer is liable to arise in an image forming device that transfers toner on the paper sheet surface that the retard roller slides on in separating paper sheets.

The present invention devised in view of the aforementioned background, and has been obtained to provide a paper feed roller capable of suppressing both sticking of paper powder and defects in toner transfer.

Means for Solving the Problem

One aspect of the present invention provides a paper feed roller for use in a paper feeding unit in an electrophotographic image forming device, the paper feed roller including:

an elastic layer composed of thermosetting polyurethane containing a plasticizer, wherein an addition amount of the plasticizer in the elastic layer is within a range of 10 to 50 pts. mass based on 100 pts. mass of the thermosetting polyurethane, and wherein a surface residual charge on a surface of the elastic layer is within a range of 90 to 170 V, where the surface residual charge is a value determined by single-point measurement of a surface potential on the surface of the elastic layer, a way of the measurement including:

rotating the paper feed roller in a circumferential direction at a rotation speed of 70 rpm in an environment at 23° C. and 53% RH, electrifying the surface of the elastic layer by applying 100 µA of corona current by use of a corotron under such a condition that a distance between a core part of the corotron and the surface of the elastic layer are 10 mm, while rotating the paper feed roller, and measuring the surface potential at a center point on the paper feed roller in a roller axis direction under such a condition that a distance between a probe of a surface electrometer and the surface of the elastic layer are 1 mm in a position where the paper feed roller is rotated by 90 degrees from a position where the surface of the elastic layer is electrified.

Effects of the Invention

The paper feed roller has the elastic layer composed of thermosetting polyurethane containing the specific addition amount of plasticizer, and the surface residual charge on the surface of the elastic layer is within the aforementioned range. Therefore, the paper feed roller can suppress both sticking of paper powder and defects in toner transfer. It can be considered that this is because of the following reasons.

When the surface residual charge of the elastic layer exceeds the aforementioned upper limit value, it can be considered that the electric resistance of the elastic layer containing the plasticizer is insufficiently made low, and thus, sticking of paper powder arises due to static electricity. On the contrary, when the surface residual charge of the elastic layer is not more than the aforementioned upper limit value, it can be considered that the electric resistance of the elastic layer containing the plasticizer is properly made low, and thus, there can be suppressed sticking of paper powder due to static electricity.

Moreover, in a paper sheet in the stage before fed by the paper feeding unit, charge is uniformly present over the whole paper sheet. Nevertheless, when the surface residual charge of the elastic layer falls below the aforementioned lower limit value, there flows the charge in the portion, of the paper sheet, that the surface of the elastic layer is in contact with (hereinafter sometimes referred to as "contact part") to the elastic layer side. Therefore, it can be considered that a potential difference arises with respect to a portion, of the paper sheet, that the surface of the elastic layer is not in contact with (hereinafter sometimes referred to as "non-contact part"), as a result, a difference in toner transfer amount arises between the contact part and the non-contact part of the paper sheet, and image concentration deteriorates in the contact part, which situation causes the phenomenon of defects in toner transfer. On the contrary, when the surface residual charge of the elastic layer is set to be not less than the aforementioned lower limit value, there hardly escapes the charge in the contact part of the paper sheet to the elastic layer side, which situation can suppress the phenomenon of defects in toner transfer.

Hence, according to the present invention, there can be provided a paper feed roller capable of suppressing both sticking of paper powder and defects in toner transfer.

MODE FOR CARRYING OUT THE INVENTION

Figure 1:
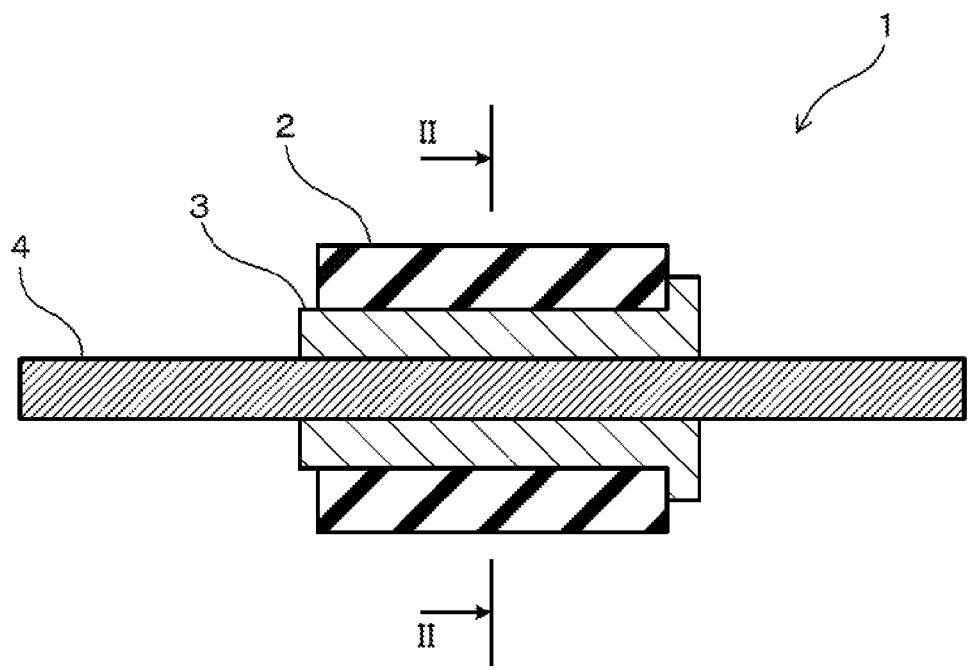
FIG. 1 is a cross-sectional view schematically illustrating a paper feed roller of Embodiment 1.

The paper feed roller is incorporated and used in a paper feeding unit in an electrophotographic image forming device. Specifically, examples of the electrophotographic image forming device can include, for example, a copying machine, a printer, a facsimile, a multifunctional machine, a POD (Print On Demand) apparatus and the like which employ the electrophotographic type using a charging image.

The paper feeding unit has a duplicate feed prevention mechanism which separates and sends out paper sheets one by one from a paper sheet cassette such that two or more paper sheets do not suffer duplicate feed. The duplicate feed prevention mechanism may employ any of the friction retarding type (FRR type) and the pad retarding type (FR type). In view of being advantageous to stable conveyance of paper sheets with high accuracy and being highly reliable in preventing duplicate feed prevention, the duplicate feed prevention mechanism can preferably employ the FRR type. The paper feeding unit in the FRR type has: a picking-up roller which comes into contact with the uppermost part of paper sheets contained in a paper sheet cassette and draws the paper sheet out of the paper sheet cassette with friction force; a feeding roller which sends out the paper sheet drawn out to a paper sheet conveying path; and a retard roller which is brought into press contact with the feeding roller and is stopped or given rotational driving force in the reverse direction to the paper sheet conveying direction via a torque limiter. In this case, the paper feed roller can be applied to any of the picking-up roller, the feeding roller and the retard roller. Above all, the paper feed roller can be preferably used as the retard roller. This is because defects in toner transfer is liable to occur on the sliding area of a paper sheet on which the elastic layer of the retard roller slides, but the paper feed roller applied to the retard roller can easily prevent the defects in the toner transfer.

In the paper feed roller, surface residual charge on the surface of the elastic layer is within a range of 90 to 170 V. By setting the surface residual charge on the surface of the elastic layer within the aforementioned range, there can be suppressed both sticking of paper powder and defects in toner transfer. When the surface residual charge on the surface of the elastic layer is smaller than 90 V, the phenomenon of defects in toner transfer is liable to arise. Therefore, the lower limit value of the surface residual charge on the surface of the elastic layer is restricted to be 90 V. Meanwhile, when the surface residual charge on the surface of the elastic layer exceeds 170 V, sticking of paper powder due to static electricity is liable to arise. Therefore, the upper limit value of the surface residual charge on the surface of the elastic layer is restricted to be 170 V.

The surface residual charge on the surface of the elastic layer can be preferably set to be 95 V or more, still preferably 100 V or more, in view of securely suppressing the phenomenon of defects in toner transfer. The surface residual charge on the surface of the elastic layer can be preferably set to be 165 V or less, still preferably 160 V or less, further preferably 155 V or less, further still preferably 150 V or less, in view of securely suppressing sticking of paper powder.

Notably, the surface residual charge (V) can be obtained by performing the following measurement. The state is set where a grounded metal-made shaft body is press-fitted into the paper feed roller and the paper feed roller is being rotated in the circumferential direction at a rotation speed of 70 rpm in the environment at 23° C. and 53% RH. Next, in this state, using a corotron, the surface of the elastic layer is electrified by applying 100 μA (constant current) of corona current with the distance between a core part of the corotron and the surface of the elastic layer set to be 10 mm. Next, at the position of 90 degrees of rotation from the position of the relevant electrification in the rotational direction, surface potential on the surface of the elastic layer is measured with the distance between a probe of a surface electrometer and the surface of the elastic layer set to be 1 mm. Notably, when the paper feed roller has a resin-made shaft body, the resin-made shaft body is taken off and the metal-made shaft body is directly press-fitted. Moreover, the surface residual charge (V) is measured at a point on a center part in the roller axis direction without the probe being moved along the roller axis direction.

In the paper feed roller, as the thermosetting polyurethane composing the elastic layer, there can be used ether-based, ester-based or caprolactone-based thermosetting polyurethane or the like. Above all, in view of being hardly hydrolyzed in the environment of use of the paper feed roller and being able to contribute to improvement of durability, ether-based thermosetting polyurethane can be preferably used. Specifically, the thermosetting polyurethane can be thermosetting polyurethane rubber (including an elastomer).

In the paper feed roller, from the viewpoint for easily setting the surface residual charge of the elastic layer within the aforementioned range, as a plasticizer to be contained in the thermosetting polyurethane, a plasticizer in which the number of ether groups contained in the molecule is two or less (including the case where no ether group is contained) is preferably employed. Examples of such a plasticizer include acetylated monoglycerides and diesters of various glycols and various aromatic carboxylic acids. More specifically, glycerol diacetate monolaurate, glycerol diacetate mono($C_8$, $C_{10}$)ester, glycerol diacetate monooleate, glycerol diacetate monostearate, alkylene glycol dibenzoate, dialkylene glycol dibenzoate, trialkylene glycol dibenzoate and the like are included. The plasticizer can be used singly or in combination with two or more kinds.

In the paper feed roller, examples of a method for setting the surface residual charge on the surface of the elastic layer within the aforementioned range can include a method of adjusting a kind and an addition amount of the aforementioned plasticizer blended in the thermosetting polyurethane, a method of adjusting kinds and addition amounts of raw material polyol and raw material isocyanate, and the like. It should be noted that the addition amount of the plasticizer is also in relation to the coefficient of friction of the surface of the elastic layer. Therefore, in this case, the addition amount of the plasticizer should be selected such that the surface residual charge on the surface of the elastic layer is within the aforementioned range while the coefficient of friction of the surface of the elastic layer is being secured. The addition amount of the plasticizer is specifically set to be within a range of 10 to 50 pts. mass relative to 100 pts. mass of thermosetting polyurethane. Notably, to the aforementioned thermosetting polyurethane, various additives other than the plasticizer may be added, such as a chain extender, a crosslinking agent, a catalyst, a conductive agent and a colorant, as long as the surface residual charge on the surface of the elastic layer can be set within the aforementioned range.

In the paper feed roller, a surface of the elastic layer can have a surface roughness capable of trapping paper powder.

In this case, paper powder can be allowed to escape to a recess part of the surface roughness on the surface of the elastic layer, which situation can suppress sticking of the paper powder to a projection part of the surface roughness, in other words, to a contact portion with the paper sheet. Therefore, in this case, there can be easily suppressed deterioration in coefficient of friction of the surface of the elastic layer due to endurance, which situation is advantageous to improving durability and being maintenance-free. Notably, further fine roughness may be formed on the surfaces of the recess parts and the projection parts constituting the surface roughness. More specifically, the surface roughness on the surface of the elastic layer can have a configuration in which an embossed surface is included, for example, which has crest-like parts and sea-like parts recessed below the crest-like parts on the surface of the elastic layer and the fine roughness is further included on the embossed surface. The ratio S1/S2 of an area S1 of the crest-like parts to an area S2 of the sea-like parts can be set within a range of 0.25 to 0.70, and the height of the projection part of the fine roughness can be set within a range of 3 to 25 μm. Moreover, the height of the crest-like part can be set to be 10 μm or more, and the distance between the tops of the neighboring crest-like parts can be set to be 1 mm or less.

In the paper feed roller, the elastic layer may be formed on the outer circumferential surface of an electrically conductive shaft body such as metal, or may be formed on the outer circumferential surface of a resin-made shaft body with electric insulation. The latter is preferable. In this case, since charge hardly flows from the elastic layer to the shaft body, the surface residual charge of the elastic layer can be easily maintained to be constant, which situation allows the aforementioned effects to be stable.

Notably, the configurations mentioned above can be arbitrarily combined as needed, for example, in order to achieve the aforementioned effects and the like.

EMBODIMENT

Hereafter, a paper feed roller of an embodiment is described using the drawings.

Embodiment 1

Figure 2:
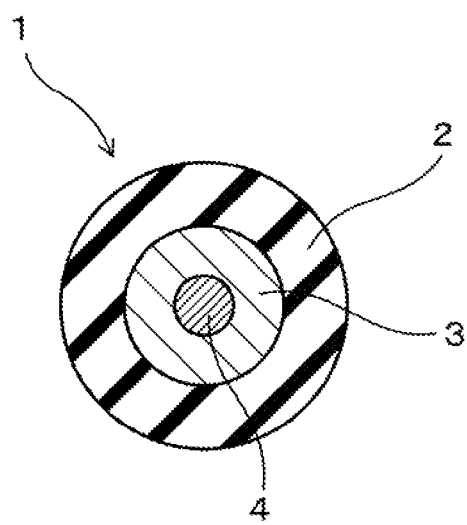
FIG. 2 is a cross-sectional view taken along II-II in FIG. 1.

A paper feed roller of Embodiment 1 is described using FIG. 1 and FIG. 2. As illustrated in FIG. 1 and FIG. 2, a paper feed roller 1 of the embodiment has an elastic layer 2 composed of thermosetting polyurethane containing a plasticizer, and the surface residual charge on the surface of the elastic layer 2 is within a range of 90 to 170 V.

In the embodiment, by using a plasticizer in which the number of ether groups contained in the molecule is two or less and adjusting the addition amount of the relevant plasticizer to the thermosetting polyurethane, the surface residual charge on the surface of the elastic layer 2 is adjusted within the aforementioned range. The elastic layer 2 has a cylindrical shape. On the surface of the elastic layer 2, the surface roughness (not shown) is provided which can trap paper powder.

The paper feed roller 1 has a resin-made shaft body 3 with electric insulation, and the elastic layer 2 is formed on the outer circumferential surface of the shaft body 3. Specifically, the shaft body 3 is formed of acetal resin into a cylindrical shape. Notably, into the cylindrical interior of the shaft body 3, there is inserted a metal-made shaft body 4 which is included in a paper feeding unit (not shown) in an electrophotographic image forming device and which is configured to be able to deliver rotational driving force.

Hereafter, the paper feed roller of the embodiment is further described in detail using Examples.

Examples

After there were defoamed and dehydrated 80 pts. mass of polytetramethylene ether glycol (PTMG) ["PTMG2000", Mn=2000, Mitsubishi Chemical Corporation], and 20 pts. mass of polypropylene glycol (PPG) ["Excenol 2020", Mn=5000, Asahi Glass Co. Ltd.] under a vacuum at 80° C. for 1 hour, 32 pts. mass of MDI was mixed to react under a nitrogen atmosphere at 80° C. for 3 hours, urethane prepolymer prepared.

Next, after the urethane prepolymer was defoamed under a vacuum at 90° C. for 30 minutes, in 100 pts. mass of urethane prepolymer, there were blended and stirred glycerol diacetate monolaurate of predetermined pts. mass presented in Table 1 as the plasticizer, 3.5 pts. mass of chain extender [1,4-butanediol (1,4-BD)], and 1.5 pts. mass of crosslinking agent [trimethylolpropane (TMP)] to be mixed under a reduced pressure for 2 minutes, and thereby, each elastic layer forming material was prepared which was used for formation of the elastic layer of the paper feed roller for each of Sample 1 to Sample 8.

Next, a die was prepared which included a through hole having a circular cross section. Notably, on the inner circumferential surface of the through hole of the die, roughness was beforehand formed corresponding to the surface roughness to be given the surface of the elastic layer.

Next, a core metal was coaxially set into the through hole of the molding die, the opening parts at both ends were closed with cap dies, and the molding space was filled with the predetermined elastic layer forming material. After that, the molding die was put in an oven to allow the urethane prepolymer to thermoset (at 150° C. for 60 minutes). Thereby, on the outer circumferential surface of the core metal, the elastic layer was formed which was composed of the thermosetting polyurethane containing the plasticizer, and after that, the elastic layer was taken off the die and drawn off the core metal to be cut into a predetermined length. As above, each elastic layer was obtained which had the cylindrical shape with φ24 mm of outer diameter, φ14 mm of inner diameter and 29.5 mm of length. Next, into the cylindrical interior of each elastic layer, a cylindrical shaft body was press-fitted which was made of acetal resin. Thus, the paper feed rollers for Sample 1 to Sample 8 were obtained.

(JIS-A Hardness)

As to the paper feed roller for each sample, the JIS-A hardness of the surface of the elastic layer was measured.

(Coefficient of Friction)

Figure 3:
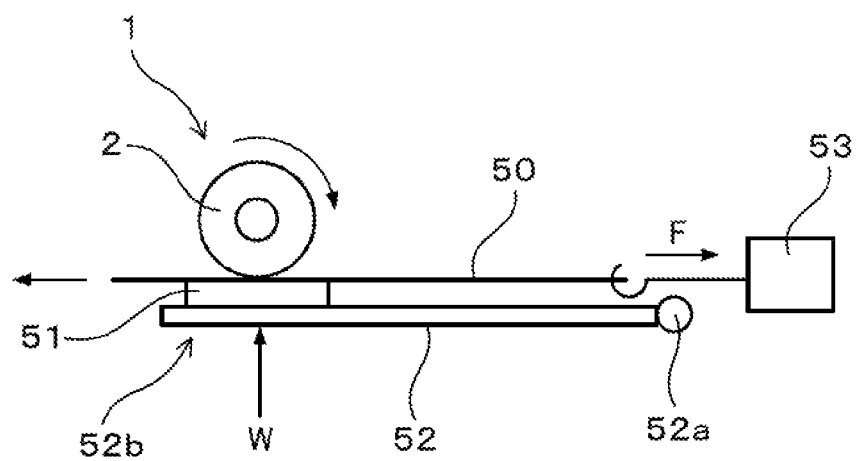
FIG. 3 is an explanatory drawing for explaining a measurement method of a coefficient of friction in Example.

As to the paper feed roller for each sample, the coefficient of friction of the surface of the elastic layer was measured. Specifically, as illustrated in FIG. 3, a PPC paper sheet 50 was pressed onto the paper feed roller 1 from its bottom with a flat plate 52 via a polytetrafluoroethylene sheet 51 [2.94 N of pressing load (W)]. The flat plate 52 was freely rotatable around an one end edge 52a which was parallel to the axis of the paper feed roller 1, and the polytetrafluoroethylene sheet 51 was fixed onto a surface of the other end side 52b of the flat plate 52 and served to allow the PPC paper sheet 50 to slide. Moreover, one end part of the PPC paper sheet 50 was connected to a load cell 53, and the paper feed roller 1 was rotated such that the PPC paper sheet 50 moved apart from the load cell 53 (180 mm/s of circumferential speed of the outer circumferential surface of the elastic layer of the paper feed roller 1). Then, the tensile force (F; unit: N) was measured with the load cell 53 which force was exerted on the PPC paper sheet 50 in the occasion when the paper feed roller 1 slipped on the PPC paper sheet 50, and the coefficient of friction ($\mu$=F/W) was calculated. Notably, the coefficient of friction was measured before a test for resistance to sticking of paper powder mentioned later was performed (initial) and after the performance (post-endurance). An initial coefficient of friction referred to the coefficient of friction before the test for resistance to sticking of paper powder mentioned later was performed, and a post-endurance coefficient of friction referred to the coefficient of friction after the test for resistance to sticking of paper powder was performed.

(Surface Residual Charge)

Figure 4:
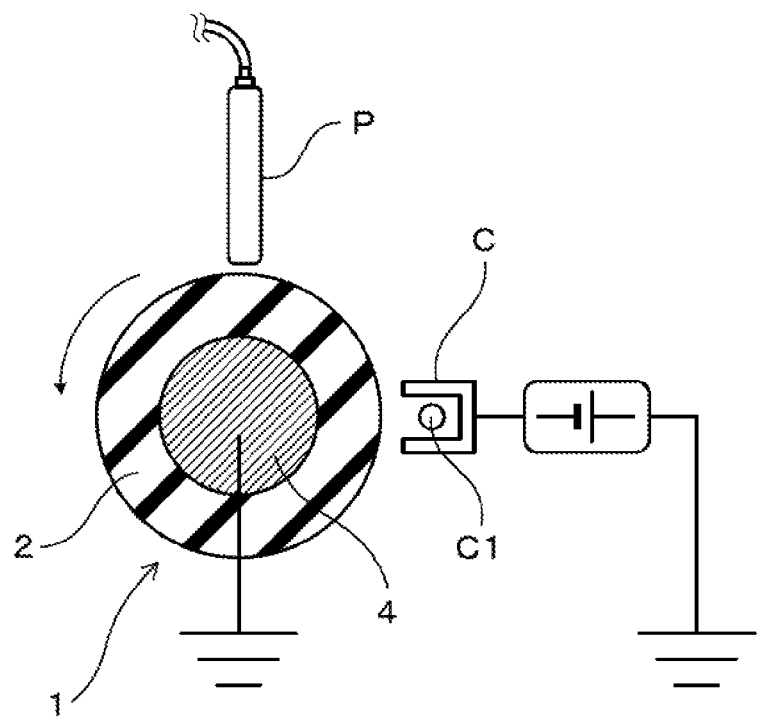
FIG. 4 is an explanatory drawing for explaining a measurement method of surface residual charge (V) in Example.

As to the paper feed roller for each sample, the surface residual charge on the surface of the elastic layer was measured. Specifically, as illustrated in FIG. 4, the resin-made shaft body 3 of the paper feed roller 1 was taken off, and instead, the metal-made shaft body 4 was directly press-fitted. The metal-made shaft body 4 was grounded and configured to be rotatable at a predetermined rotation speed. Then, in the state where the paper feed roller 1 was being rotated at a rotation speed of 70 rpm in the circumferential direction in the environment at 23° C. and 53% RH, using a corotron C (in use of a DC power supply), the surface of the elastic layer 2 was electrified by applying 100 μA (constant current) of corona current with the distance between a core part C1 of the corotron C and the surface of the elastic layer 2 set to be 10 mm. Next, at the position of 90 degrees of rotation from the position of the relevant electrification in the rotational direction, the surface potential on the surface of the elastic layer 2 was measured at one point on a center part in the roller axis direction with the distance between a probe P of a surface electrometer and the surface of the elastic layer 2 set to be 1 mm. This was regarded as the surface residual charge on the surface of the elastic layer 2 in the paper feed roller 1 for each sample.

(Evaluation of Defects in Toner Transfer)

As to the paper feed roller for each sample, defects in toner transfer were evaluated. Specifically, the paper feed roller was incorporated as the retard roller of the paper feeding unit in an electrophotographic multifunctional machine ("imageRUNNER ADVANCE C5051", Canon Inc.). In this stage, the setting of the torque limiter of the retard roller was changed to be 600 gf·cm such that the retard roller became in the stopped state in paper feed. By doing so, the state was set where the retard roller slid on a paper sheet. Then, a halftone image (25% of black) was outputted in the environment at 23° C. and 53% RH. The outputted image was visually confirmed, "A" was decided as suppression of the phenomenon of defects in toner transfer when unevenness in image concentration did not arise in the portion, of the paper sheet, that the surface of the elastic layer of the retard roller slid on, and "C" was decided as no suppression of the phenomenon of defects in toner transfer when the aforementioned unevenness in image concentration arose.

(Evaluation of Resistance to Sticking of Paper Powder)

As to the paper feed roller for each sample, resistance to sticking of paper powder was evaluated. Specifically, the paper feed roller was incorporated as the retard roller of the paper feeding unit in the electrophotographic multifunctional machine ("imageRUNNER ADVANCE C5051", Canon Inc.). Then, after 300,000 sheets of plain paper were fed in the environment at 23° C. and 53% RH, the coefficient of friction (post-endurance coefficient of friction) was measured by the aforementioned method. "A" was decided as the presence of resistance to sticking of paper powder and the suppression of sticking of paper powder when the post-endurance coefficient of friction was 1.3 or more, and "C" was decided as no suppression of sticking of paper powder when the post-endurance coefficient of friction was smaller than 1.3.

Table 1 collectively presents relation between the addition amount of the plasticizer and the surface residual charge of the elastic layer, various measurement results, and evaluation results as to the paper feed rollers for the individual samples.

TABLE 1

|  | Sample 1 | Sample 2 | Sample 3 | Sample 4 | Sample 5 | Sample 6 | Sample 7 | Sample 8 |
|---|---|---|---|---|---|---|---|---|
| Addition Amount of Plasticizer (phr) | 50 | 40 | 30 | 20 | 10 | 0 | 60 | 5 |
| JIS-A Hardness (°) | 47 | 52 | 57 | 63 | 67 | 75 | 43 | 70 |
| Initial Coefficient of Friction | 2.10 | 1.90 | 1.70 | 1.56 | 1.45 | 1.30 | 2.20 | 1.33 |
| Surface Residual Charge (V) | 90 | 112 | 130 | 152 | 170 | 185 | 80 | 177 |

TABLE 1-continued

|  | Sample 1 | Sample 2 | Sample 3 | Sample 4 | Sample 5 | Sample 6 | Sample 7 | Sample 8 |
|---|---|---|---|---|---|---|---|---|
| Evaluation of Defects in Toner Transfer | A | A | A | A | A | A | C | A |
| Evaluation of Resistance to Sticking of Paper Powder | A | A | A | A | A | C | A | C |
| Post-endurance Coefficient of Friction | 1.45 | 1.40 | 1.38 | 1.36 | 1.30 | 1.05 | 1.52 | 1.20 |

Based on Table 1, the following facts are apparent. Namely, in the paper feed roller for Sample 6, a plasticizer is not included in the thermosetting polyurethane composing the elastic layer. Therefore, the paper feed roller for Sample 6 has high hardness of the elastic layer and a low initial coefficient of friction. Moreover, the post-endurance coefficient of friction is also low, which shows that sticking of paper powder cannot be suppressed.

In the paper feed roller for Sample 7, the surface residual charge on the surface of the elastic layer is 80 (V) and falls below the lower limit value, of the surface residual charge, which is defined in the present specification. Therefore, the paper feed roller for Sample 7 cannot suppress the phenomenon of defects in toner transfer. It can be considered that this is because there has escaped the charge in the portion, of the paper sheet, that the surface of the elastic layer of the retard roller slides on (sliding part) to the elastic layer side, as a result, a potential difference arises with respect to a portion, of the paper sheet, that the surface of the elastic layer of the retard roller does not slide on (non-sliding part), and as a result, a difference in toner transfer amount arises between the sliding part and the non-sliding part, which situation causes deterioration of image concentration in the sliding part.

In the paper feed roller for Sample 8, the surface residual charge on the surface of the elastic layer is 177 (V) and exceeds the upper limit value, of the surface residual charge, which is defined in the present specification. Therefore, the paper feed roller for Sample 8 cannot suppress sticking of paper powder. It can be considered that this is because the electric resistance of the elastic layer containing the plasticizer is insufficiently made low, and sticking of paper powder is liable to arise due to static electricity.

On the contrary, in the paper feed rollers for Sample 1 to Sample 5, there is included the elastic layer composed of the thermosetting polyurethane containing the plasticizer, and the surface residual charge on the surface of the elastic layer is within the range defined in the present specification. Therefore, these paper feed rollers can suppress both sticking of paper powder and defects in toner transfer. It can be considered that this is because, since the surface residual charge of the elastic layer is set to be not more than the upper limit value defined in the present specification as to the paper feed rollers for Sample 1 to Sample 5, the electric resistance of the elastic layer containing the plasticizer is properly made low, which situation can suppress sticking of paper powder due to static electricity. Moreover, it can also be considered that this is because, since the surface residual charge of the elastic layer is set to be not less than the lower limit value defined in the present specification as to the paper feed rollers for Sample 1 to Sample 5, the charge in the sliding part of the paper sheet hardly escapes to the elastic layer side.

While the embodiment of the present invention has been described in detail as above, the present invention is not limited to the aforementioned embodiment, but various modifications may occur without departing from the spirit of the present invention.

For example, while there is presented the example in which the paper feed roller of the present invention is applied to the retard roller in the aforementioned embodiment, the paper feed roller of the present invention can also be applied to the picking-up roller and the feeding roller. This is because, also in the picking-up roller and the feeding roller, the surface of the elastic layer is in contact with and slides on a paper sheet.

The invention claimed is:

1. A paper feed roller for use in a paper feeding unit in an electrophotographic image forming device, the paper feed roller comprising:
   an elastic layer composed of thermosetting polyurethane containing a plasticizer,
   wherein an addition amount of the plasticizer in the elastic layer is within a range of 10 to 50 pts. mass based on 100 pts. mass of the thermosetting polyurethane, and
   wherein a surface residual charge on a surface of the elastic layer is within a range of 90 to 170 V, where the surface residual charge is a value determined by single-point measurement of a surface potential on the surface of the elastic layer, a way of the measurement including:
   rotating the paper feed roller in a circumferential direction at a rotation speed of 70 rpm in an environment at 23° C. and 53% RH,
   electrifying the surface of the elastic layer by applying 100 μA of corona current by use of a corotron under such a condition that a distance between a core part of the corotron and the surface of the elastic layer are 10 mm, while rotating the paper feed roller, and
   measuring the surface potential at a center point on the paper feed roller in a roller axis direction under such a condition that a distance between a probe of a surface electrometer and the surface of the elastic layer are 1 mm in a position where the paper feed roller is rotated by 90 degrees from a position where the surface of the elastic layer is electrified.

2. The paper feed roller according to claim 1, wherein the plasticizer is at least one kind selected from the group consisting of glycerol diacetate monolaurate, glycerol diacetate mono($C_8$, $C_{10}$)ester, glycerol diacetate monooleate, glycerol diacetate monostearate, alkylene glycol dibenzoate, dialkylene glycol dibenzoate and trialkylene glycol dibenzoate.

3. The paper feed roller according to claim 2, wherein a surface of the elastic layer has a surface roughness capable of trapping paper powder.

4. The paper feed roller according to claim 3, wherein the elastic layer is formed on an outer circumferential surface of a resin-made shaft body with electric insulation.

5. The paper feed roller according to claim 4, the paper feed roller is for use of a retard roller.

6. The paper feed roller according to claim 5, wherein the paper feeding unit is of a friction retard type.

7. The paper feed roller according to claim 3, wherein the plasticizer is at least one kind selected from the group consisting of glycerol diacetate monolaurate, alkylene glycol dibenzoate, and dialkylene glycol dibenzoate.

8. The paper feed roller according to claim 3, wherein the plasticizer is at least one kind selected from the group consisting of ethylene glycol dibenzoate, and diethylene glycol dibenzoate.

9. The paper feed roller according to claim 3, wherein the surface roughness is configured to include an embossed surface including crest-like parts and sea-like parts recessed below the crest-like parts on the surface of the elastic layer, and further including a fine roughness on the embossed surface.

10. The paper feed roller according to claim 9, wherein an area S1 of the crest-like parts and an area S2 of the sea-like parts have a ratio S1/S2 set within a range of 0.25 to 0.70.

11. The paper feed roller according to claim 9, wherein the fine roughness has a projection part having a height set within a range of 3 to 25 μm.

12. The paper feed roller according to claim 9, wherein the crest-like part has a height set to be 10 μm or more, and a distance between tops of the crest-like parts neighboring each other is 1 mm or less.

13. The paper feed roller according to claim 9,
wherein an area S1 of the crest-like parts and an area S2 of the sea-like parts have a ratio S1/S2 set within a range of 0.25 to 0.70,
wherein the fine roughness has a projection part having a height set within a range of 3 to 25 μm, and
wherein the crest-like part has a height set to be 10 μm or more, and a distance between tops of the crest-like parts neighboring each other is 1 mm or less.

14. The paper feed roller according to claim 13, wherein the thermosetting polyurethane is ether-based, and the surface residual charge is within a range of 100 to 150 V.

15. The paper feed roller according to claim 3, wherein the thermosetting polyurethane is at least one kind selected from the group consisting of ether-based thermosetting polyurethane, ester-based thermosetting polyurethane and caprolactone-based thermosetting polyurethane.

16. The paper feed roller according to claim 3, wherein the thermosetting polyurethane is ether-based.

17. The paper feed roller according to claim 3, wherein the surface residual charge is within a range of 95 to 165 V.

18. The paper feed roller according to claim 3, wherein the surface residual charge is within a range of 100 to 160 V.

19. The paper feed roller according to claim 3, wherein the surface residual charge is within a range of 100 to 155 V.

20. The paper feed roller according to claim 3, wherein the surface residual charge is within a range of 100 to 150 V.

* * * * *